United States Patent
Chung et al.

(10) Patent No.: US 6,168,905 B1
(45) Date of Patent: Jan. 2, 2001

(54) ETCHING METHOD FOR MULTI-LEVEL TERRACED STRUCTURES

(75) Inventors: Chen-Kuei Chung; Chien-Chih Lee; Ching-Yi Wu, all of Hsinchu (TW)

(73) Assignee: Industrial Technology Research Institute, Hsinchu (TW)

( * ) Notice: Under 35 U.S.C. 154(b), the term of this patent shall be extended for 0 days.

(21) Appl. No.: 09/143,114

(22) Filed: Aug. 28, 1998

(51) Int. Cl.$^7$ ............................................. G03C 5/00

(52) U.S. Cl. ............................................ 430/313; 430/311

(58) Field of Search ................................ 430/313, 311, 430/312, 5, 322, 323, 327

(56) References Cited

U.S. PATENT DOCUMENTS 5,866,281 * 2/1999 Guckel et al. ......................... 430/22

OTHER PUBLICATIONS

Vangbo, Mattias and Backlund, Ylva, Terracing of (100) Si with one mask and one etching step using misaligned V–grooves, Journal of Micromechanics and Microengineering, vol. 6, No. 1, p. 39–41, Mar. 1996.*

* cited by examiner

*Primary Examiner*—Mark F. Huff
*Assistant Examiner*—Saleha R. Mohamedulla
(74) *Attorney, Agent, or Firm*—Bacon & Thomas

(57) ABSTRACT

An etching method for a semiconductor substrate to form a multi-level terraced structures is disclosed. A photomask is used to prepare a etching mask on a semiconductor substrate for a multi-level terraced structure. Said photomask has a pattern with a plurality of regions. Widths of the masked areas of the pattern are so designed that the etching rate of the etchant to respective parts of the substrate may be controlled, whereby a multi-level terraced structure with decided widths and heights of all levels may be prepared with one single photomask under one single etching step. This invention also discloses the photomask used in the etching method and products prepared according to the etching method.

10 Claims, 3 Drawing Sheets

ETCHING METHOD FOR MULTI-LEVEL TERRACED STRUCTURES

FIELD OF THE INVENTION

The present invention relates to a method for etching a multi-level terraced structure in a semiconductor substrate, especially to a method to prepare a multi-level terraced structure in a semiconductor substrate, using only one photomask and one etching step. This invention also discloses a photo mask suited for the etching method of this invention and the product therefrom.

BACKGROUND OF THE INVENTION

The multi-level structure is widely used in the fields of the optical system and the microelectromechanical system. Good examples include diffractive lens used in the micro optical system. In the conventional art, a multi-level structure is prepared with a "terraced" structure wherein a semiconductor substrate is burned-off with laser beams or etched in an etchant so that a terraced structure is prepared to function as a multi-level structure. Among the approaches in the preparation of the terraced structure, etching is welcome by the industry due to its relatively low preparation costs.

In the conventional art, a terraced or multi-level structure is prepared with a plurality of etching processes, using a plurality of photomasks. A first photomask is used to form a first etching mask prepared with a photoresist on the semiconductor substrate. After etching the substrate in an etchant, a two-level terrace is formed. Then a second photomask is used to form a second etching mask on the semiconductor substrate, whereby a four-level terrace is formed. And so on. After n etching processes, a $2^n$-level terrace is prepared. If the material of the substrate is silicon or germanium, the multi-level terraced structure may function as a diffractive lens for the infrared application.

As described above, in the conventional art, a plurality of photomasks and etching steps are used to prepare a multi-level terraced structure. This approach is not only labor, time and material consuming but also creates problems in the alignment of each photomasks. U.S. patent application Ser. No. 08/909,089 relates to "Diffractive leans and preparation method thereof". In this invention disclosed is a method for the preparation of a multi-level terraced structure using one single photomask and one single etching step. According to this invention, the widths of the masked areas and their intervals of the pattern in the photomask are decided such that a multi-level terraced structure may be prepared with one single photomask under one single etching step and that the widths and heights of the levels of the terraced structure may be decided accordingly.

Although the above-said invention enables the preparation of a multi-level terraced structure with one single photomask and under one single etching step, the design of the pattern for the photomask requires complicated calculations. Many factors are taken for consideration so that a multi-level terraced structure with required widths and heights of all levels may be prepared.

it is thus a need in the industry to have a simplified etching method for multi-level terraced structures such that multi-level terraced structures with decided widths and heights of all levels may be prepared with one single photomask under one single etching step.

OBJECTIVES OF THE INVENTION

The objective of this invention is to provide a novel etching method for multi-level terraced structure whereby multi-level terraced structures with decided widths and heights of all levels may be prepared with one single photomask under one single etching step.

Another objective of this invention is to provide a simplified etching method for multi-level terraced structure whereby multi-level terraced structures with decided widths and heights of all levels may be prepared with one single photomask under one single etching step.

Another objective of this invention is to provide a photomask suited in the above-said etching method for multi-level terraced structure.

SUMMARY OF THE INVENTION

According to the etching method for multi-level terraced structure of this invention, a photomask with a plurality of regions is disclosed. Widths of the masked areas of the pattern on the photomask are so decided that the etching rate of the etchant to respective parts of the substrate may be controlled, whereby a multi-level terraced structure with decided widths and heights of all levels may be prepared with one single photomask under one single etching step. This invention also discloses the photomask used in the etching method and products prepared according to the etching method.

These and other objectives and advantages of this invention may be clearly understood from the detailed description by referring to the following drawings.

IN THE DRAWINGS

DETAILED DESCRIPTION OF THE INVENTION

The preparation of a multi-level terraced structure with one single photomask (etching mask) under one single etching step has been know to the industry. A brief description to the development of this technology may be referred to Mattias Vangbo and Yiva Baecklund: "Terracing of (100) Si with One mask and One Etching Step misaligned V-Grooves", Journal of Micromechanics and Microengineering, Vol. 6, No. 1, March 1996, P. 39. Detailed description thereof is thus omitted.

In this invention, a simplified method for the preparation of a multi-level structure is disclosed.

Figure 1:
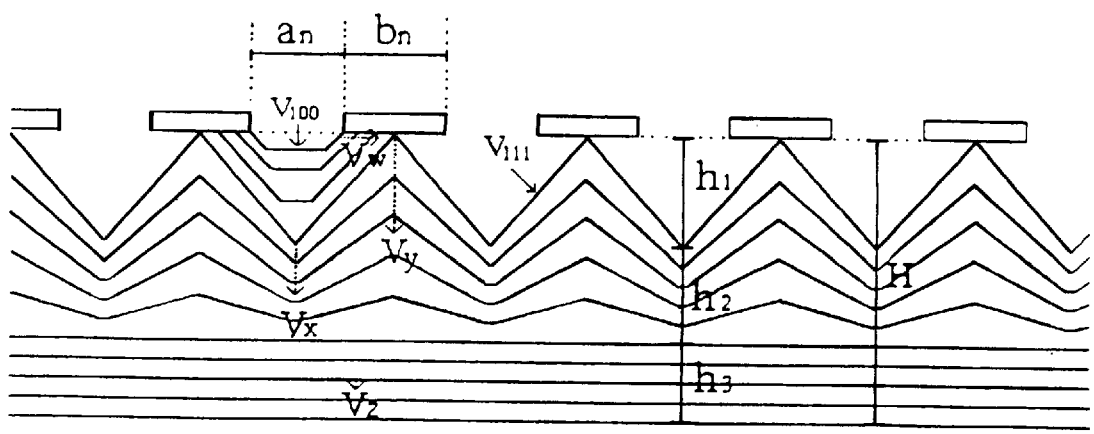
FIG. 1 illustrates factors in the etching of a multi-level structure using one single photomask under one single etching step.

FIG. 1 illustrates factors in the etching of a multi-level structure using one single photomask under one single etching step. In this figure, factors shown include etching depth of the multi-level structure ($H_n$), width of masked areas of the etching mask ($b_n$) and width of the intervals between masked areas ($a_n$).

Etching of a semiconductor substrate to form a multi-level structure includes the following stages: undercutting, breakthrough and planarization.

In the undercutting stage, if time needed from the undercutting of the substrate to the breakthrough of the substrate under the etching mask is $t_1$ and the etching depth is $h_1$, then we have:

$$t_1 = \frac{b_n/2}{V_w} = \frac{b_n}{2V_w} \qquad (1)$$

$$h_1 = \frac{a_n + b_n}{\sqrt{2}} \qquad (2)$$

wherein $b_n$ is the line width to be underetched, $V_w$ is the underetching rate at an angle $\beta$ off the [110]-direction (see FIG. 1).

In the second stage, if time needed from the breakthrough to the planarization is $t_2$ and the etching depth is $h_2$, then we have:

$$V_y t_2 - V_x t_2 = h_1$$

$$t_2 = \frac{h_1}{V_y - V_x} = \frac{a_n + b_n}{\sqrt{2}(V_y - V_x)} \qquad (3)$$

$$h_2 = V_x t_2 = \frac{(a_n + b_n)V_x}{\sqrt{2}(V_y - V_x)} = \frac{(a_n + b_n)}{\sqrt{2}\left(\frac{V_y}{V_x} - 1\right)} = \frac{(a_n + b_n)}{\sqrt{2}(R_{yx} - 1)} \qquad (4)$$

Where $V_y$ is the average downward etching rate between the top of the V-groove and he planarization; $V_x$ is also the average downward etching rate between the bottom of the V-groove and the planarization. $R_{yx}$ is the ratio of $V_y$ to $V_x$.

After the planarization, the relation between the etching time $t_3$ and the etching depth $h_3$ is:

$$h_3 = V_z t_3 \qquad (5)$$

Where $V_z$ is equal to $V_{100}$, the etching rate in the [100] direction and $h_3$ is the etching depth after $t_3$ from the planarization.

Let the total etching time to be T, then we have:

$$T = t_1 + t_2 + t_3 = \frac{b_n}{2V_w} + \frac{a_n + b_n}{\sqrt{2}(V_y - V_x)} + t_3 \qquad (6)$$

$$t_3 = T - \left(\frac{b_n}{2V_w} + \frac{a_n + b_n}{\sqrt{2}(V_y - V_x)}\right)$$

Let the total etching depth to be $H_n$, then we have:

$$H_n = h_1 + h_2 + h_3 = \frac{a_n + b_n}{\sqrt{2}} + \frac{(a_n + b_n)}{\sqrt{2}(R_{yx} - 1)} + t_3 V_z$$

$$= \frac{a_n + b_n}{\sqrt{2}}\left(\frac{R_{yx}}{R_{yx} - 1}\right) + t_3 V_z$$

$$= \frac{a_n + b_n}{\sqrt{2}}\left(\frac{1}{1 - R_{xy}}\right) + t_3 V_z$$

$$= \frac{a_n + b_n}{\sqrt{2}}\left(\frac{1}{1 - R_{xy}}\right) + \left[T - \left(\frac{b_n}{2V_w} + \frac{a_n + b_n}{\sqrt{2}(V_y - V_x)}\right)\right]V_z$$

We then have:

$$H_n = f(a_n, b_n, T) = \frac{a_n + b_n}{\sqrt{2}}\left(\frac{1 - R_{zy}}{1 - R_{xy}}\right) - \frac{b_n}{2}R_{zw} + TV_z \qquad (7)$$

Wherein $$R_{zy} = \frac{V_z}{V_y}; \quad R_{zw} = \frac{V_z}{V_w} \quad \text{and} \quad R_{xy} = \frac{V_x}{V_y}.$$

Figure 2:
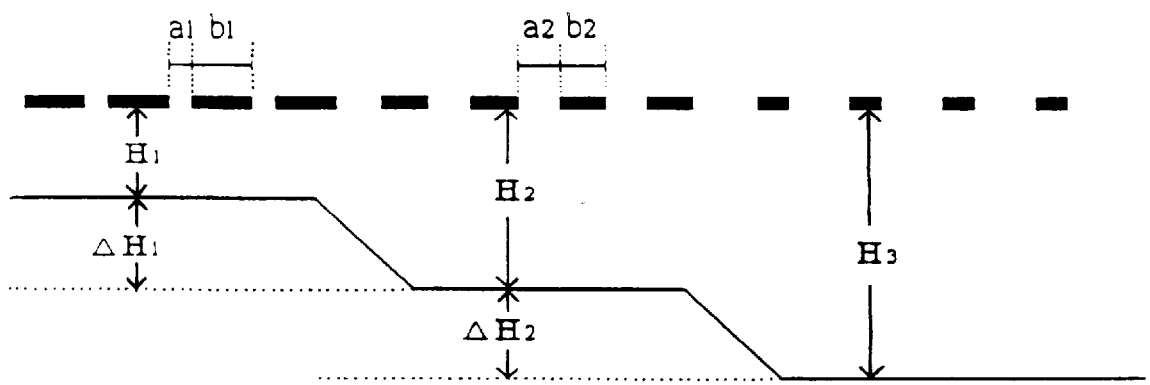
FIG. 2 illustrates the schematic diagram of an etching system for a three-level terraced structures.

$R_{xy}$ is relative to $a_n$, $b_n$, T and $R_{zw}$. The difference between each two levels ($\Delta H_n$) may be discussed as follows:

FIG. 2 illustrates the schematic diagram of an etching system for a three-level terraced structures, using one single photomask. According to known anisotropic wet etching theories, the widths of the masked areas and their intervals of the pattern in the etching mask have certain relations with the widths and heights of the levels of the multi-level terraced structure prepared with the etching mask. In FIG. 2, the depth of etching for the first level (the top level) is represented by $H_1$. The depth of the second level is represented by $H_2$, for the third level is $H_3$ and so on. The etching mask is divided into regions according to the corresponding levels of the multi-level terraced structure, each region containing a plurality of masked areas and their intervals. At the first level region, which corresponds to the first level of the multi-level terraced structure, the width of the masked areas is $b_1$ and the width of their intervals is $a_1$. At the second level region, widths of the masked areas and their intervals are $b_2$ and $a_2$, respectively. At the third level region, widths of the masked areas and their intervals are $b_3$ and $a_3$ and so on. The difference in the etching depths of the first level and the second level in the multi-level terraced structure is $\Delta H_1$, in that of the second level and the third level is $\Delta H_2$ and so on.

From the above Equation (7) we have:

$$H_1 = \frac{a_1 + b_1}{\sqrt{2}}\left(\frac{1 - R_{zy}}{1 - R_{xy}}\right) - \frac{b_1}{2}R_{zw} + TV_z$$

$$H_2 = \frac{a_2 + b_2}{\sqrt{2}}\left(\frac{1 - R_{zy}}{1 - R_{xy}}\right) - \frac{b_2}{2}R_{zw} + TV_z$$

Thus: $\Delta H_1 = H_2 - H_1 = \dfrac{\left(\dfrac{1 - R_{zy}}{1 - R_{xy}}\right)[(a_2 + b_2) - (a_1 + b_1)]}{\sqrt{2}} + \dfrac{(b_1 - b_2)}{2}R_{zw}$ The height of the terrace between level n and level n+1 will be:

$$\Delta H_n = H_{n+1} - H_n \qquad (8)$$

$$= \left(\frac{1 - R_{zy}}{\sqrt{2}(1 - R_{xy})}\right)[(a_{n+1} + b_{n+1}) - (a_n + b_n)] +$$

$$\frac{R_{zw}}{2}(b_n - b_{n+1})$$

$$= C_1[(a_{n+1} + b_{n+1}) - (a_n + b_n)] + C_2(b_n - b_{n+1})$$

wherein $b_{n+1} < b_n$, $a_{n+1} > a_n$ and $$C_1 = \left(\frac{1 - R_{zy}}{\sqrt{2}\,(1 - R_{xy})}\right),\ C_2 = \frac{R_{zw}}{2}.$$

Although it is not intended to limit the scope of this invention, it is found that in the application of the multi-level terraced structure, the value of $\Delta H_n$ may be constant. In other words, a multi-level structure with constant etching depth difference may satisfy most requirements in the application of the multi-level terraced structure. As a result, we have:

$$\Delta H_1 = \Delta H_2 = \ldots = \Delta H_n = \Delta H_{n-1} = \Delta H.$$

From Equation (8) we have:

$$(a_{n+2} + b_{n+2}) + (a_n + b_n) = 2(a_{+1} + b_{n+1})\text{ and}$$

$$b_{n+2} + b_n = 2b_{n+1}$$

It is clearly shown that [an+bn] and [bn] are both artihmatic progressions and thus [an] is also an arithmatic progression.

Based on the above premises, it is further found by the inventor that in an etching system, the influence of $b_n$ to $\Delta H$ is far greater than that of $a_n$ to $\Delta H$. If $a_n$ is constant and $C_2 \gg C_1$, then the relation between $\Delta H$ and $b_n$ may be simplified and expressed as:

$$\Delta H = (C_2 - C_1)(b_n - b_{n+1}) = C_2(b_n - b_{n+1}) \tag{9}$$

wherein $\Delta H$ represents the constant difference of etching depths of each two levels, $b_n$ represents the width of the masked areas of the pattern at the nth level region and $C_2$ represents a constant. $C_2$ is relative to the ratio of the etching rates from the [100] vertical direction to the lateral direction ($R_{zw} = V_z/V_w$). $C_2$ is also relative to the misalignment in the silicon [110] direction. When the misalignment of $(b_n - b_{n+1})$ is added, the lateral etching rate $V_w$ will increase and the difference in the depth of the levels will decrease.

According to the above findings, a simplified etching method for multi-level terraced structure may be accomplished. The following is a detailed description of a diffractive lens with a multi-level terraced structure as prepared according to the etching method of this invention.

Embodiments

Figure 3:
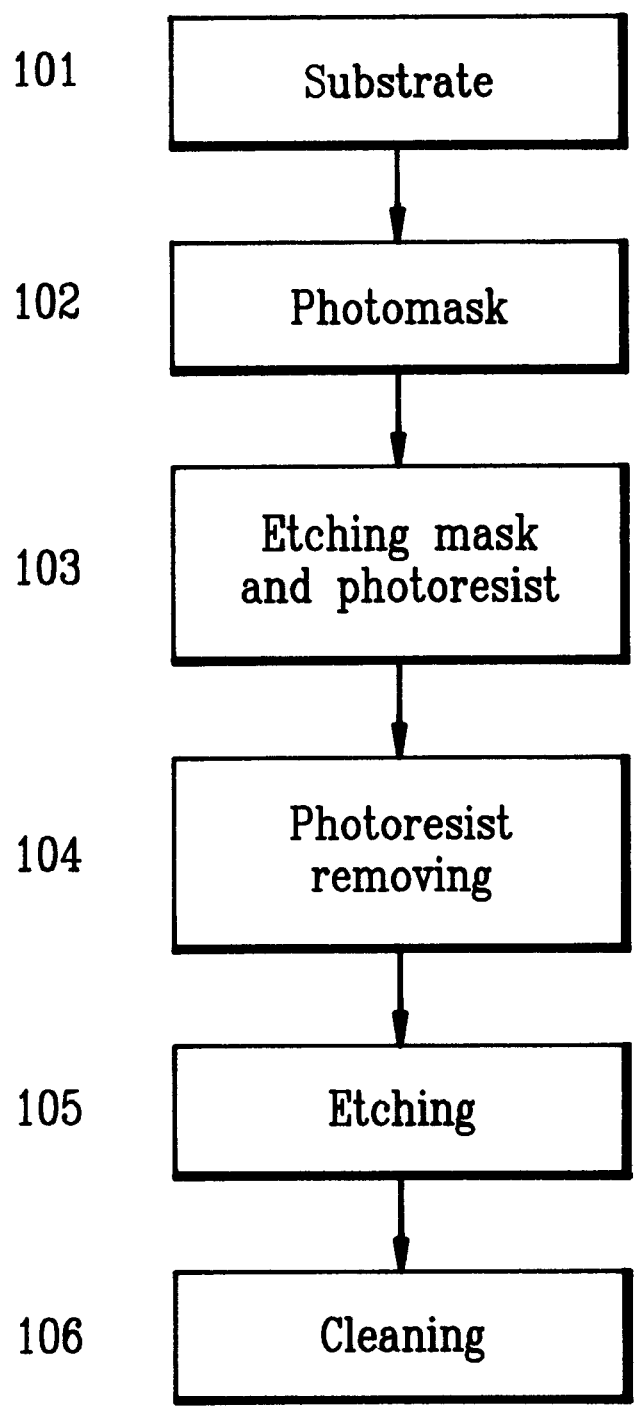
FIG. 3 illustrates the flow chart of the etching method for multi-level structures of this invention.

FIG. 3 illustrates the flow chart for an embodiment of the etching method for multi-level terraced structures of this invention. As shown in this figure, at 101 a substrate to prepare a multi-level terraced structure is prepared. Because the product will function as a diffractive lens, material for the substrate may be silicon or germanium. Of course, other material that is suited in the preparation of multi-level terraced structures may be applied in this invention. At 102 a photomask is prepared. In order to obtain decided widths and heights of all levels of a multi-level terraced structure, the pattern of the photomask is designed in a special way.

Now refer to FIG. 2 which illustrates a four-level terraced structure and a photomask suited to prepare the four-level terraced structure. In this embodiment, as described above, all intervals of the masked areas have the same width, all masked areas have the width of a constant difference and all levels have the difference in height of $\Delta H$. That is: $\Delta H_1 = \Delta H_2 = \Delta H_3 = \Delta H$.

Again, as described above, the relation between the difference in height of the levels, of the multi-level terraced structure to be prepared, and the widths of the masked areas of the etching mask is:

$$\Delta H = C_2(b_n - b_{n+1}) \tag{9}$$

wherein definitions for $\Delta H$, $C_2$ and $b_n$ are the same as above and $b_n > b_{n+1}$.

Under the above-said relation, the widths of the levels of the multi-level terraced structure to be prepared may be decided by the widths of the level regions of the pattern of the photomask. In the pattern of the photomask (and in the etching mask), each level region contains a plurality of masked areas with same widths. The widths of the masked areas descend at a constant interval from the top level region to the deepest level region. The difference of widths between the masked areas of two adjacent level regions is:

$$(b_n - b_{n+1}) = \Delta H / C_2 \tag{10}$$

At 103 a etching mask layer and a photoresist layer is applied to the substrate. Suited materials for the etching mask include S3N4/SiO$_2$ or Si$_3$N$_4$. The pattern of the photomask is transferred to the etching mask with the conventional lithographic technology. At 104 the photoresist is removed such that the etching mask is exposed to the environment. At 105 the substrate is put in an etchant for about 150 minutes. Enchants suited in this invention include KOH-water solution (KOH:water=40 g: 100 ml), EDP ethylene diamine pyrocatechol, Hydrazine, TMAH and other enchants applicable to etch a multi-level terraced structure. At 106 when a four-level terraced structure is prepared, the substrate is taken from the etchant and the etching mask is removed. A four-level terraced structure is thus accomplished.

In the embodiments of this invention, the scope of alpha varies from 10 to 50 under the following conditions:

$$a_1 = a_2 = \ldots = 8\ \mu m$$

$\Delta b = b_n = b_{n+1} = 1\ \mu m$, with the misalignment angle at silicon [110] direction of 0.95 degree.

Etching temperature is 70° C. under a 40% KOH solution.

Figure 4:
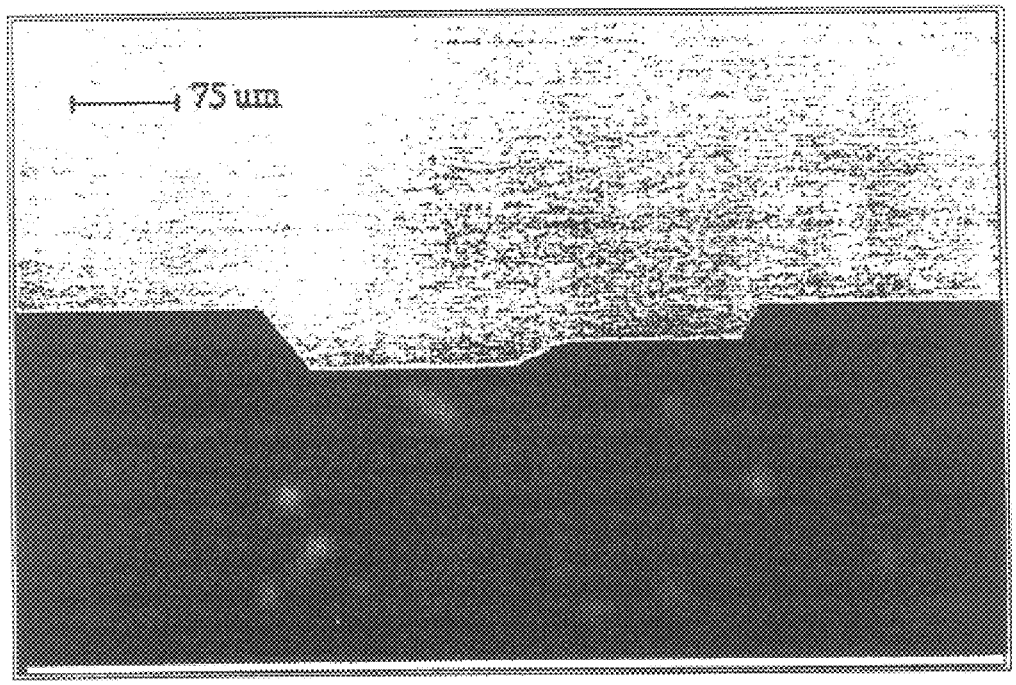
FIG. 4 illustrates the cross sectional view of a four-level terraced structure prepared according to the etching method for multi-level terraced structures of this invention.

The product so prepared is observed under a microscope. FIG. 4 illustrates the sectional view of a four-level terraced structure prepared according to the etching method for multi-level terraced structures of this invention. As shown in this figure, a four-level terraced structure with needed widths and heights of all levels is prepared with one photomask under one etching step.

Figure 5:
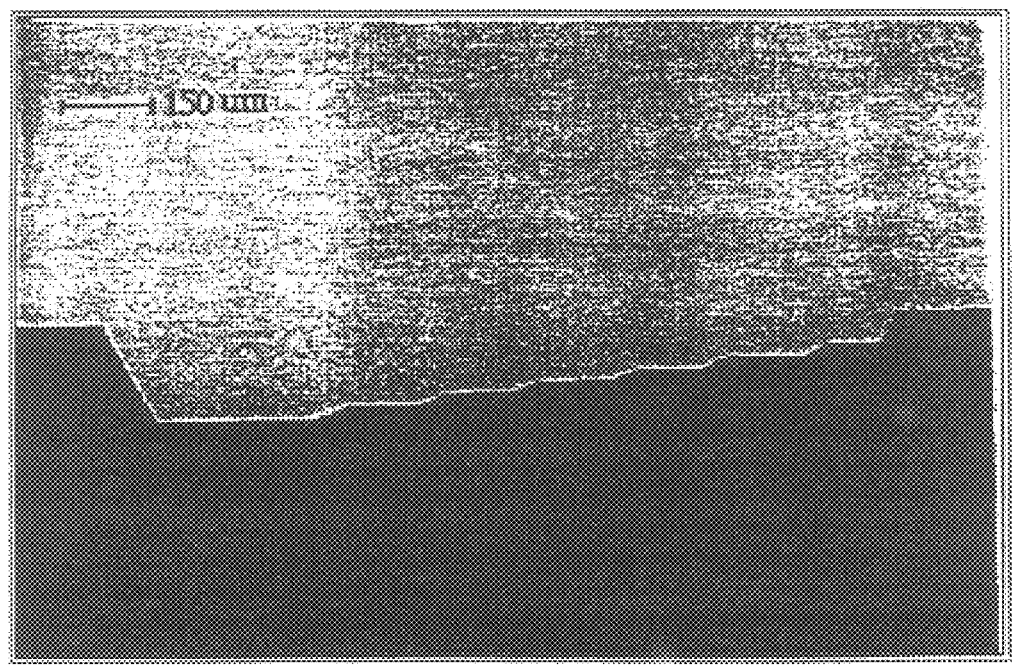
FIG. 5 illustrates the sectional view of an eight-level terraced structure prepared according to the etching method for multi-level terraced structures of this invention.

FIG. 5 illustrates the cross sectional view of an eight-level terraced structure prepared with the etching method for multi-level terraced structures of this invention. The cross sectional view of the eight-level terraced structure is a photographic picture taken under a microscope. It is proved that the etching method of this invention is applicable to multi-level terraced structures.

As the present invention has been shown and described with reference to preferred embodiments thereof, those skilled in the art will recognize that the above and other changes may be made therein without departing from the spirit and scope of the invention.

What is claimed is:

1. A method for preparing a multi-level terraced structure in a semiconductor material, comprising the steps of:

preparing only one substrate comprising an etching material;

preparing a photomask with a pattern comprising masked areas and intervals therebetween;

forming a layer of etching mask material on the substrate;

transferring said pattern of said photomask to said layer of etching mask material by lithographic technology to obtain an etching mask; and etching said layer of etching mask material in an etchant;

wherein said photomask comprises a plurality of regions and each region comprises a plurality of masked areas and intervals therebetween wherein the width of the masked areas belonging to the same region comprises a constant value;

characterized in that width of said masked areas varies from region to region at a constant difference, as follows:

$b_{n-1} - b_n = \Delta H / C_2$; wherein $b_n$ represents the width of the masked areas of the nth region, $\Delta H$ represents a constant difference in the height of levels of the multi-level structure to be prepared, $C_2$ represents a constant relative to a misaligned angle to the crystal lattice plane direction and $b_{n-1} > b_n$ and that the width intervals between said masked areas is of a constant value.

2. The method according to claim 1 wherein $C_2$ is between 10 and 50.

3. The method according to claim 1 or 2 wherein said etching material is at least one selected from silicon and germanium.

4. The method according to claim 1 or 2 wherein said etchant is at least one selected from KOH-water solution, EDP, Hydrazine and TMAH.

5. A method for preparing a multi-level terraced structure in a semiconductor material, comprising the steps of:

preparing a substrate comprising an etching material;

preparing a photomask with a pattern comprising masked areas and intervals therebetween;

forming a layer of etching mask material on the substrate;

transferring said pattern of said photomask to said layer of etching mask material by lithographic technology to obtain an etching mask; and etching said layer of etching mask material in an etchant;

wherein said photomask comprises a plurality of regions and each region comprises a plurality of masked areas and intervals therebetween wherein the width of the masked areas belonging to the same region comprises a constant value;

characterized in that width of said masked areas varies from region to region at a constant difference, as follows:

$b_{n-1} - b_n = \Delta H / C_2$; wherein $b_n$ represents the width of the masked areas of the nth region, $\Delta H$ represents a constant difference in the height of levels of the multi-level structure to be prepared, $C_2$ represents a constant relative to a misaligned angle to Si[110] direction and $b_{n-1} > b_n$ and that the width intervals between said masked areas is of a constant value.

6. A method as claimed in claim 1, 2 or 5, wherein the substrate is germanium.

7. A method as claimed in claim 2, 1, 5 or 6, wherein the substrate is silicon.

8. A method as claimed in claim 2, 1, 5 or 6, wherein the formed multi-level terrace structure has 4 terrace levels.

9. A method as claimed in claim 2, 1, 5 or 6, wherein the formed multi-level terrace structure has 8 terrace levels.

10. A method as claimed in claim 1, wherein the multi-level terraced structure has at least three levels.

* * * * *